(12) United States Patent
Toyomura et al.

(10) Patent No.: US 10,438,820 B2
(45) Date of Patent: Oct. 8, 2019

(54) SUBSTRATE PROCESSING APPARATUS, DISCHARGE METHOD, AND PROGRAM

(71) Applicant: EBARA CORPORATION, Tokyo (JP)

(72) Inventors: Naoki Toyomura, Tokyo (JP); Akira Imamura, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 16/088,691

(22) PCT Filed: Oct. 23, 2017

(86) PCT No.: PCT/JP2017/038126
§ 371 (c)(1),
(2) Date: Sep. 26, 2018

(87) PCT Pub. No.: WO2018/110086
PCT Pub. Date: Jun. 21, 2018

(65) Prior Publication Data
US 2019/0115230 A1 Apr. 18, 2019

(30) Foreign Application Priority Data
Dec. 12, 2016 (JP) .................................. 2016-240315

(51) Int. Cl.
*H01L 21/304* (2006.01)
*H01L 21/67* (2006.01)
(Continued)

(52) U.S. Cl.
CPC ........ *H01L 21/67075* (2013.01); *B08B 9/027* (2013.01); *H01L 21/304* (2013.01);
(Continued)

(58) Field of Classification Search
CPC ............. H01L 21/67075; H01L 21/304; H01L 21/67051; H01L 21/67057; H01L 21/683;
(Continued)

(56) References Cited

U.S. PATENT DOCUMENTS 5,522,412 A * 6/1996 Ohba ................ H01L 21/67051
118/70
5,678,116 A * 10/1997 Sugimoto ............. G03F 7/3021
396/611
(Continued)

FOREIGN PATENT DOCUMENTS

CN 101013661 A 8/2007
CN 204029777 U 12/2014
(Continued)

OTHER PUBLICATIONS

International Patent Application No. PCT/JP2017/038126; Int'l Written Opinion and the Search Report; dated Dec. 12, 2017; 7 pages.
(Continued)

*Primary Examiner* — Craig J Price
(74) *Attorney, Agent, or Firm* — Baker & Hostetler LLP

(57) ABSTRACT

A substrate processing apparatus including: a first valve provided between a gas supply source and an air-water separation tank, the first valve opening and closing a flow path of a gas supplied from the gas supply source; a second valve that opens and closes a flow path of liquid discharged from a discharge port of the air-water separation tank; and a control unit that controls the first valve and the second valve. The discharge port of the air-water separation tank communicates with a discharge port of a cleaning chamber that cleans the substrate, and the control unit controls to close the first valve after preset gas supply time elapses from when the first valve is opened and gas can no longer be discharged from the air-water separation tank and controls to close the second valve after the first valve is closed.

9 Claims, 4 Drawing Sheets

(51) Int. Cl.
*B08B 9/027* (2006.01)
*H01L 21/683* (2006.01)
*G03F 7/20* (2006.01)

(52) U.S. Cl.
CPC .... *H01L 21/67017* (2013.01); *H01L 21/6719* (2013.01); *H01L 21/67057* (2013.01); *H01L 21/67173* (2013.01); *H01L 21/67219* (2013.01); *H01L 21/683* (2013.01); *G03F 7/70725* (2013.01); *G03F 7/70841* (2013.01); *H01L 21/67051* (2013.01)

(58) Field of Classification Search
CPC . B08B 9/027; G03F 7/70341; G03F 7/70716; G03F 7/70725; G03F 7/70841
USPC ... 137/173, 897, 896, 565.23, 487.5, 624.11, 137/624.18
See application file for complete search history.

(56) References Cited

U.S. PATENT DOCUMENTS

| | | | | |
|---|---|---|---|---|
| 7,481,867 B2 * | 1/2009 | Harpham | ............ | G03F 7/70341 95/266 |
| 8,164,734 B2 * | 4/2012 | Harpham | ............ | G03F 7/70341 355/30 |
| 8,830,440 B2 * | 9/2014 | Harpham | ............ | G03F 7/70341 355/30 |
| 8,934,082 B2 * | 1/2015 | Mertens | ............ | G03F 7/70716 355/53 |
| 9,507,270 B2 * | 11/2016 | Harpham | ............ | G03F 7/70341 |
| 2007/0175387 A1 | 8/2007 | Kimura | | |
| 2009/0067959 A1 | 3/2009 | Takahashi et al. | | |
| 2012/0024394 A1 * | 2/2012 | Bounouar | ............... | F04D 19/04 137/14 |
| 2015/0266159 A1 | 9/2015 | Shiokawa et al. | | |
| 2017/0014873 A1 | 1/2017 | Higuchi et al. | | |

FOREIGN PATENT DOCUMENTS

| | | |
|---|---|---|
| CN | 104924198 A | 9/2015 |
| CN | 106104762 A | 11/2016 |
| JP | 2007-201330 A | 8/2007 |
| JP | 2015-150648 A | 8/2015 |
| JP | 2015-191897 A | 11/2015 |
| KR | 2008-0106933 A | 12/2008 |
| KR | 2010-0103120 A | 9/2010 |

OTHER PUBLICATIONS

Korean Patent Application No. 10-2018-7031584; Notice of Allowance; dated Feb. 11, 2019; 4 pages.
China Patent Application No. 201780026476.4; Office Action; dated Jun. 18, 2019; 9 pages.

* cited by examiner

SUBSTRATE PROCESSING APPARATUS, DISCHARGE METHOD, AND PROGRAM

RELATED APPLICATION

This application claims the benefit of patent application number 2016-240315 filed on Dec. 12, 2016 in Japan, the contents of which are incorporated herein by reference.

TECHNICAL FIELD

The present technique relates to a substrate processing apparatus, a discharge method, and a program.

BACKGROUND ART

As the miniaturization of a semiconductor progresses, the size thereof in a horizontal direction is reduced, and the structure thereof in a vertical direction is also complicated. Therefore, there is a growing need for a technique that planarizes the surface of a semiconductor substrate (wafer) and facilitating processing. Among such planarization techniques, a chemical mechanical polishing (CMP) technique is particularly increasing in its importance. A substrate processing apparatus is used to perform various kinds of processing on a substrate (wafer) such as a semiconductor substrate. As an example of this substrate processing apparatus, a polishing apparatus that polishes a substrate such as a wafer by using the CMP technique can be cited (refer to Patent Literature 1).

The polishing apparatus using the CMP technique includes a polishing unit that performs polishing processing of a substrate, a cleaning unit that performs cleaning processing of the substrate, a drying unit that performs drying processing of the cleaned substrate, and a load/unload unit that transfers the substrate to the polishing unit and receiving the substrate subjected to the dying processing. Furthermore, the polishing apparatus includes a transfer unit that transfers the substrate between the polishing unit, the cleaning unit, and the load/unload unit. The polishing apparatus sequentially performs various kinds of processing such as polishing, cleaning and drying while transferring the substrate by the transfer unit.

An adsorption stage used in a cleaning tank or the like of the cleaning unit is provided with a vacuum adsorption line to vacuum-adsorb a substrate. Since the air and cleaning water remaining on the substrate are sucked from a throughhole for vacuum adsorption on the vacuum adsorption line when the substrate is vacuum-adsorbed, these moisture needs to be separated by an air-water separation tank. For this reason, the air-water separation tank is connected to the vacuum adsorption line (refer to Patent Literature 1).

CITATION LIST

Patent Literature

Patent Literature 1: JP 2015-150648 A

SUMMARY OF INVENTION

A substrate processing apparatus of one embodiment comprising: a first valve provided between a gas supply source and an air-water separation tank, the first valve opening and closing a flow path of a gas supplied from the gas supply source; a second valve that opens and closes a flow path of liquid discharged from a discharge port of the air-water separation tank; and a control unit that controls the first valve and the second valve, wherein the discharge port of the air-water separation tank communicates with a discharge port of a cleaning chamber that cleans the substrate, and the control unit controls to close the first valve after preset gas supply time elapses from when the first valve is opened and gas can no longer be discharged from the air-water separation tank and controls to close the second valve after the first valve is closed.

DESCRIPTION OF EMBODIMENTS

Figure 1:
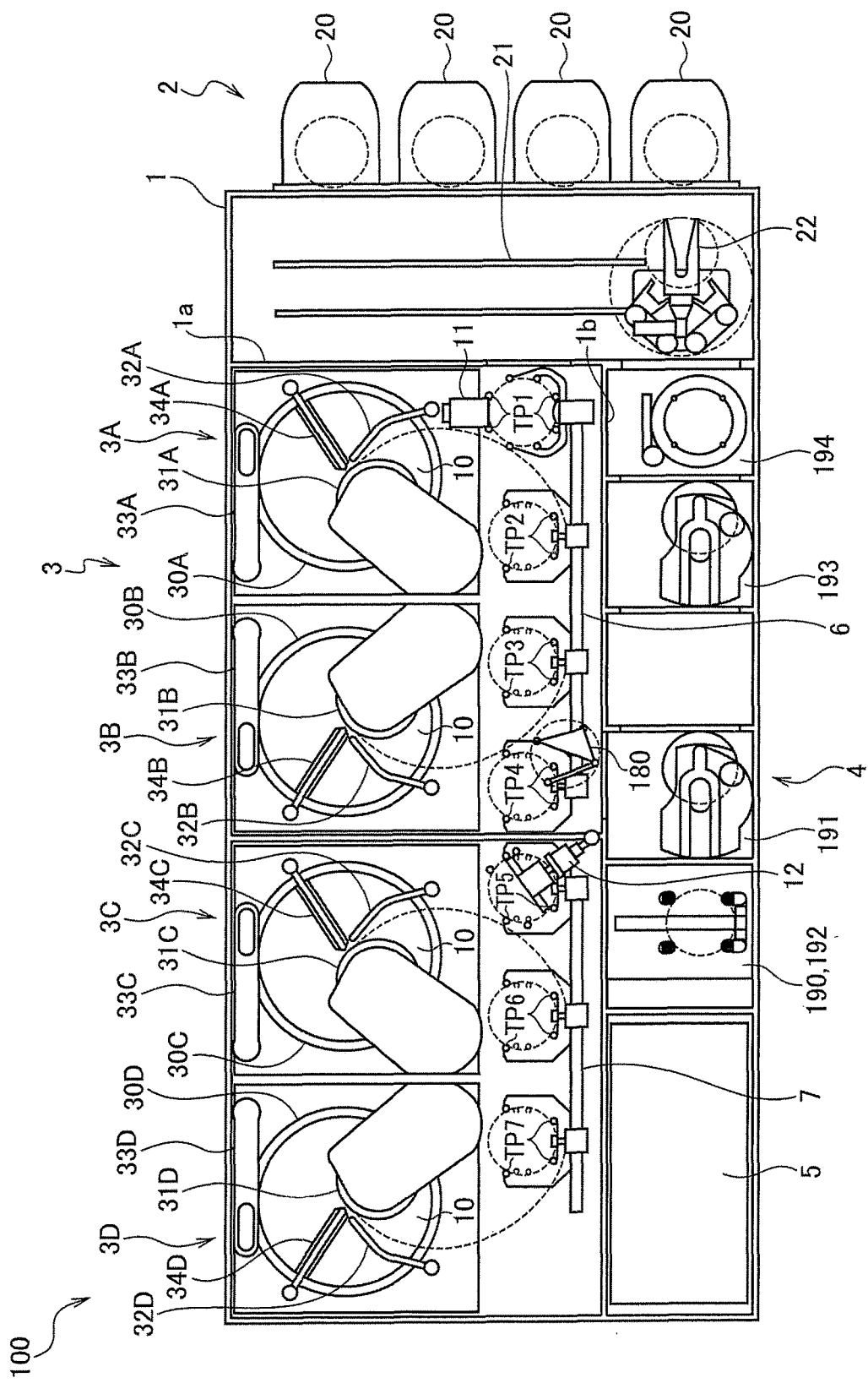
FIG. 1 is a plan view illustrating an overall configuration of a substrate processing apparatus 100 according to an embodiment of the present technique.

A discharge port for liquid in an air-water separation tank communicates with a drainage port of a cleaning chamber via a drain pipe. A gas (for example, pressurized nitrogen) is continuously supplied to the air-water separation tank when the liquid accumulated in the air-water separation tank used for an adsorption stage used in this cleaning tank or the like is discharged. However, there is a possibility that supplying the gas continuously to the air-water separation tank causes a contaminated atmosphere and/or liquid to flow back into the cleaning chamber and contaminate a substrate.

[Embodiment]

It is desired to provide a substrate processing apparatus, a discharge method, and a program that enable reduction in the possibility of contamination of the substrate in the cleaning chamber.

A substrate processing apparatus according to a first aspect of one embodiment comprising: a first valve provided between a gas supply source and an air-water separation tank, the first valve opening and closing a flow path of a gas supplied from the gas supply source; a second valve that opens and closes a flow path of liquid discharged from a discharge port of the air-water separation tank; and a control unit that controls the first valve and the second valve, wherein the discharge port of the air-water separation tank communicates with a discharge port of a cleaning chamber that cleans the substrate, and the control unit controls to close the first valve after preset gas supply time elapses from when the first valve is opened and gas can no longer be discharged from the air-water separation tank and controls to close the second valve after the first valve is closed.

According to this configuration, by supplying the gas to the air-water separation tank during the gas supply time, a trigger for drainage can be given. Therefore, thereafter, the liquid accumulated in the air-water separation tank can naturally be drained. Furthermore, since the gas is supplied to the air-water separation tank only during the gas supply time, a back-flow of the contaminated atmosphere and/or liquid into the cleaning chamber can be suppressed, and a possibility of contamination of the substrate in the cleaning chamber can be reduced.

A substrate processing apparatus according to a second aspect of one embodiment, in the substrate processing apparatus according to the first aspect, wherein the gas supply time is equal to or longer than minimum gas supply time necessary for drainage and the minimum gas supply time is set according to at least a pressure of a gas of the gas supply source.

According to this configuration, since the gas can be supplied to the air-water separation tank for time longer than the minimum gas supply time, the trigger for drainage from the air-water separation tank can be given.

A substrate processing apparatus according to a third aspect of one embodiment, in the substrate processing apparatus according to the second aspect, wherein the minimum gas supply time is set according to a cross-sectional area inside a part having a smallest inner diameter of a pipe connecting between the gas supply source and the air-water separation tank.

According to this configuration, this minimum gas supply time can be appropriately set, and the gas is supplied to the air-water separation tank for time equal to or longer than the minimum gas supply time. Therefore, the trigger for drainage from the air-water separation tank can be given.

A substrate processing apparatus according to a fourth aspect of one embodiment, in the substrate processing apparatus according to the second or the third aspect, wherein the minimum gas supply time is set according to a minimum required volume of a gas to be supplied in order to give a trigger for drainage when the air-water separation tank is full.

According to this configuration, the minimum gas supply time can be set to time during which an amount of a gas with which an amount of liquid when the air-water separation tank is full can be discharged is supplied. The gas is supplied to the air-water separation tank for a time period longer than this minimum gas supply time period. Therefore, the trigger for drainage from the air-water separation tank can be given regardless of an amount of liquid in the air-water separation tank.

A substrate processing apparatus according to a fifth aspect of one embodiment, in the substrate processing apparatus according to any one of the first to the fourth aspect, wherein a gas discharge port of the air-water separation tank capable of communicating with an adsorption stage of the cleaning chamber so that the gas of the gas supply source is supplied to the adsorption stage of the cleaning chamber, and a pressure of the gas supply source is set within a range in which a substrate can be peeled off from the adsorption stage of the cleaning chamber and the substrate does not jump.

Note that "the substrate jumps" means that the substrate suddenly come off from the adsorption stage, and if the substrate unintentionally jumps from the stage, the substrate may be damaged.

According to this configuration, the substrate can be peeled off from the adsorption stage and it is possible to prevent the substrate from jumping.

A substrate processing apparatus according to a sixth aspect of one embodiment, in the substrate processing apparatus according to the fifth aspect, wherein a gas discharge port of the air-water separation tank capable of communicating with an adsorption stage of the cleaning chamber so that the gas of the gas supply source is supplied to the adsorption stage of the cleaning chamber, and a pressure of the gas supply source is set within a range in which a substrate can be peeled off from the adsorption stage of the cleaning chamber and the substrate does not jump.

According to this configuration, in the case of the wafer having a diameter of 300 mm, the wafer can be peeled off from the adsorption stage VS1 and the wafer can be lifted to the receiving position at which the transfer robot receives the wafer.

A substrate processing apparatus according to a seventh aspect of one embodiment, in the substrate processing apparatus according to any one of the first to the sixth aspect, wherein time from when the first valve is closed until when the second valve is closed is set according to required time for drainage that is set according to the pressure of the gas of the gas supply source.

According to this configuration, the second valve can be opened for time longer than the required time for drainage. Therefore, all of the liquid accumulated in the air-water separation tank can be discharged.

A discharge method according to an eighth aspect of one embodiment, a discharge method of liquid in an air-water separation tank in a substrate processing apparatus, the method comprising steps of: closing a first valve that is provided between a gas supply source and the air-water separation tank and that opens and closes a flow path of a gas supplied from the gas supply source after preset gas supply time elapses from when the first valve is opened and the gas can no longer be discharged from the air-water separation tank; and closing a second valve that opens and closes a flow path of the liquid discharged from a discharge port of the air-water separation tank after the first valve is closed.

According to this configuration, by supplying the gas to the air-water separation tank during the gas supply time, a trigger for drainage can be given. Therefore, thereafter, the liquid accumulated in the air-water separation tank can naturally be drained. Furthermore, since the gas is supplied to the air-water separation tank only during the gas supply time, a back-flow of the contaminated atmosphere and/or liquid into the cleaning chamber can be suppressed, and a possibility of contamination of the substrate in the cleaning chamber can be reduced.

A program according to a ninth aspect of one embodiment, a program to cause a computer to function as a control unit that controls a first valve that is provided between a gas supply source and an air-water separation tank and that opens and closes a flow path of a gas supplied from the gas supply source, and a second valve that opens and closes a flow path of liquid discharged from a discharge port of the air-water separation tank, wherein the discharge port of the air-water separation tank communicates with a discharge port of a cleaning chamber for cleaning a substrate, and the control unit controls to close the first valve after a preset gas supply time elapses from when the first valve is opened and a gas can no longer be discharged from the air-water separation tank and controls to close the second valve after the first valve is closed.

According to this configuration, by supplying the gas to the air-water separation tank during the gas supply time, a trigger for drainage can be given. Therefore, thereafter, the liquid accumulated in the air-water separation tank can naturally be drained. Furthermore, since the gas is supplied to the air-water separation tank only during the gas supply time, a back-flow of the contaminated atmosphere and/or liquid into the cleaning chamber can be suppressed, and a possibility of contamination of the substrate in the cleaning chamber can be reduced.

Hereinafter, the substrate processing apparatus according to an embodiment of the present technique will be described with reference to the drawings. Specifically, as an example of the substrate processing apparatus, a polishing apparatus using a CMP technique will be described. Note that techniques including any combination of individual constituent elements to be described below are also included in a technical concept that is a target of the present technique.

[Overview]

FIG. 1 is a plan view illustrating an overall configuration of the substrate processing apparatus 100 according to the embodiment of the present technique. As illustrated in FIG. 1, this substrate processing apparatus 100 includes a housing 1 having a substantially rectangular shape, and the interior of the housing 1 is partitioned by partition walls 1a and 1b into a load/unload unit 2, a polishing unit 3, and a cleaning unit 4. The load/unload unit 2, the polishing unit 3, and the cleaning unit 4 are independently assembled and gases therein are independently exhausted. The cleaning unit 4 is partitioned into a first cleaning chamber 190, a first transfer chamber 191, a second cleaning chamber 192, a second transfer chamber 193, and a drying chamber 194. In the present embodiment, as an example, the first cleaning chamber 190 and the second cleaning chamber 192 are disposed in a state in which the first cleaning chamber 190 and the second cleaning chamber 192 are stacked in two upper and lower stages. Furthermore, the substrate processing apparatus 100 has a control unit 5 that controls a substrate processing operation.

[Load/Unload Unit]

The load/unload unit 2 includes two or more (four in the present embodiment) front load units 20 on which a wafer cassette that stores a large number of wafers (substrate) is placed. These front load units 20 are disposed adjacently to the housing 1 and are arranged along a width direction (direction perpendicular to a lengthwise direction) of the substrate processing apparatus 100. An open cassette, a standard manufacturing interface (SMIF) pod, or a front opening unified pod (FOUP) can be mounted on the front load unit 20. Here, the SMIF and the FOUP are airtight containers that can hold an environment independent from an external space by accommodating the wafer cassette therein and covering the wafer cassette with a partition wall.

Furthermore, a traveling mechanism 21 is laid along a row of the front load units 20 in the load/unload unit 2, and a transfer robot (loader) 22 that is movable along an arrangement direction of the wafer cassette on this traveling mechanism 21 is installed. The transfer robot 22 can access the wafer cassette mounted on the front load unit 20 by moving on the traveling mechanism 21. The transfer robot 22 includes two upper and lower hands. The upper hand is used when the processed wafer is returned to the wafer cassette, and the lower hand is used when the wafer before processing is taken out from the wafer cassette. Thus, the upper and lower hands can be used selectively. Moreover, the lower hand of the transfer robot 22 is configured such that the lower hand can reverse the wafer by rotating the lower hand around the axis thereof.

Since the load/unload unit 2 is a region that needs to be maintained in the cleanest state, the inside of the load/unload unit 2 is always maintained at a higher pressure than any of the substrate processing apparatus 100, the polishing unit 3, and the cleaning unit 4. The polishing unit 3 is the dirtiest region because slurry is used as polishing liquid. Therefore, a negative pressure is formed inside the polishing unit 3, and the pressure is maintained to be lower than an internal pressure of the cleaning unit 4. A filter fan unit (not illustrated) having a clean air filter such as a high efficiency particulate air filter (HEPA) filter, an ultra low penetration air (ULPA) filter, and a chemical filter is provided in the load/unload unit 2, and clean air from which particles, toxic vapor, toxic gases have been removed is constantly blowing out from this filter fan unit.

[Polishing Unit]

The polishing unit 3 is a region where wafer polishing (planarization) is performed, and includes a first polishing unit 3A, a second polishing unit 3B, a third polishing unit 3C, and a fourth polishing unit 3D. As illustrated in FIG. 1, the first polishing unit 3A, the second polishing unit 3B, the third polishing unit 3C, and the fourth polishing unit 3D are arranged along the lengthwise direction of the substrate processing apparatus 100.

As illustrated in FIG. 1, the first polishing unit 3A includes a table 30A to which a polishing pad 10 having a polishing surface is attached, a top ring (polishing head) 31A for polishing the wafer while holding the wafer and pressing the wafer against the polishing pad 10 on the table 30A, a polishing liquid supply nozzle (polishing liquid supply unit) 32A for supplying polishing liquid and dressing liquid (for example, pure water) to the polishing pad 10, a dresser 33A for performing dressing of the polishing surface of the polishing pad 10, and an atomizer 34A for injecting fluid to the polishing surface and sucking fluid existing on the polishing surface. For example, the fluid is a gas (for example, nitrogen gas), mixed fluid of liquid (for example, pure water) and a gas (for example, nitrogen gas), or liquid (for example, pure water). The fluid may be a mist of the liquid.

Similarly, the second polishing unit 3B includes a table 30B to which the polishing pad 10 is attached, a top ring (polishing head) 31B, a polishing liquid supply nozzle 32B, a dresser 33B, and an atomizer 34B. The third polishing unit 3C includes a table 30C to which the polishing pad 10 is attached, a top ring (polishing head) 31C, a polishing liquid supply nozzle 32C, a dresser 33C, and an atomizer 34C. The fourth polishing unit 3D includes a table 30D to which the polishing pad 10 is attached, a top ring (polishing head) 31D, a polishing liquid supply nozzle 32D, a dresser 33D, and an atomizer 34D.

[Transfer Mechanism]

Next, a transfer mechanism for transferring the wafer will be described. As illustrated in FIG. 1, a first linear transporter 6 is disposed adjacently to the first polishing unit 3A and the second polishing unit 3B. This first linear transporter 6 is a mechanism that transfers the wafer between four transfer positions along a direction in which the first polishing unit 3A and the second polishing unit 3B are arranged (a first transfer position TP1, a second transfer position TP2, a third transfer position TP3, and a fourth transfer position TP4 in order from a load/unload side).

Furthermore, a second linear transporter 7 is disposed adjacently to the third polishing unit 3C and the fourth polishing unit 3D. This second linear transporter 7 is a mechanism that transfers the wafer between three transfer positions along a direction in which the third polishing unit 3C and the fourth polishing unit 3D are arranged (a fifth transfer position TP5, a sixth transfer position TP6, and a seventh transfer position TP7 from the load/unload side).

The wafer is transferred to the first polishing unit 3A and the second polishing unit 3B by the first linear transporter 6. As described above, the top ring 31A of the first polishing unit 3A moves between a polishing position and the second transfer position TP2 by a swing motion of a top ring head (not illustrated). Therefore, the wafer is transferred to the top ring 31A at the second transfer position TP2. Similarly, a top ring 31B of the second polishing unit 3B moves between the polishing position and the third transfer position TP3, and the wafer is transferred to the top ring 31B at the third transfer position TP3. A top ring 31C of the third polishing unit 3C moves between the polishing position and the sixth transfer position TP6, and the wafer is transferred to the top ring 31C at the sixth transfer position TP6. A top ring 31D of the fourth polishing unit 3D moves between the polishing position and the seventh transfer position TP7, and the wafer is transferred to the top ring 31D at the seventh transfer position TP7.

A lifter 11 for receiving the wafer from the transfer robot 22 is disposed at the first transfer position TP1. The wafer is passed from the transfer robot 22 to the first linear transporter 6 via this lifter 11. A shutter (not illustrated) is provided at a partition wall 1a while being positioned between the lifter 11 and the transfer robot 22 so that when the wafer is transferred, the shutter is opened and the wafer is passed from the transfer robot 22 to the lifter 11. Furthermore, a swing transporter 12 is disposed between the first linear transporter 6, the second linear transporter 7, and the cleaning unit 4. This swing transporter 12 has a hand movable between the fourth transfer position TP4 and the fifth transfer position TP5, and the wafer is transferred from the first linear transporter 6 to the second linear transporter 7 by the swing transporter 12. The wafer is transferred to the third polishing unit 3C and/or the fourth polishing unit 3D by the second linear transporter 7. Furthermore, a temporary placement table 180 of a wafer W installed in a frame (not illustrated) is disposed on a lateral side of the swing transporter 12. As illustrated in FIG. 1, this temporary placement table 180 is disposed adjacently to the first linear transporter 6 and is positioned between the first linear transporter 6 and the cleaning unit 4. The wafer W polished by the polishing unit 3 is placed on the temporary placement table 180 via the swing transporter 12 and thereafter, the wafer W is transferred to the cleaning unit 4 by a transfer robot of the cleaning unit 4.

[Cleaning Unit]

The cleaning unit 4 is partitioned into the first cleaning chamber 190 that cleans the substrate, the first transfer chamber 191, the second cleaning chamber 192 that cleans the substrate, the second transfer chamber 193, and the drying chamber 194. In the first cleaning chamber 190, a plurality of primary cleaning modules arranged along a longitudinal direction is disposed. Similarly, in the second cleaning chamber 192, a plurality of secondary cleaning modules arranged along the longitudinal direction is disposed. The primary module and the secondary cleaning module are cleaning machines that clean the wafer with cleaning liquid.

In the drying chamber 194, a plurality of drying modules arranged along the longitudinal direction is disposed. The plurality of drying modules is isolated from each other. A filter fan unit that supplies clean air to the drying modules is provided on the top of the drying modules. Each cleaning module and drying module are fixed to a frame (not illustrated) via bolts or the like.

Figure 2:
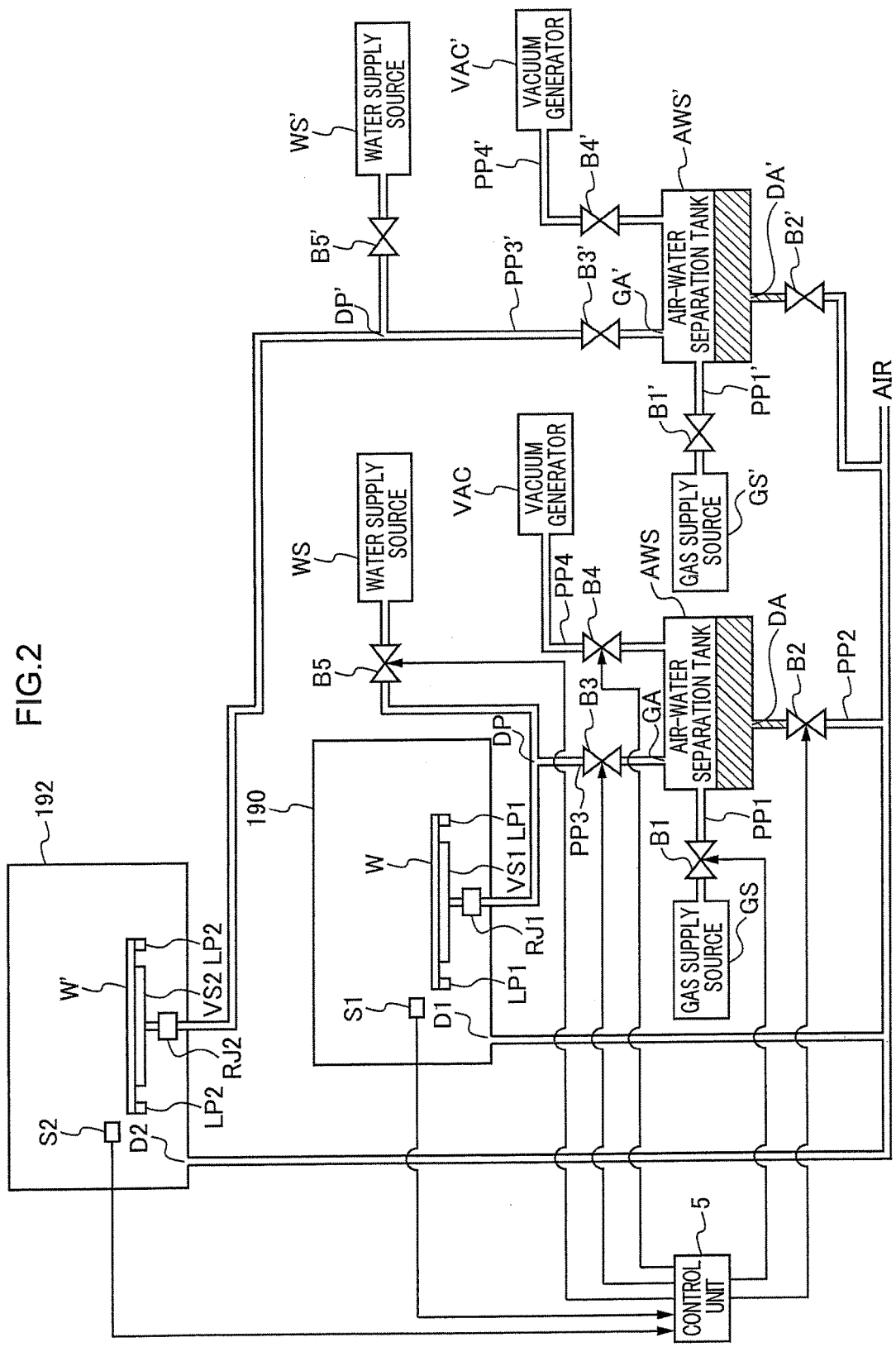
FIG. 2 is a schematic view illustrating a configuration of pipes of a first cleaning chamber 190 and a second cleaning chamber 192.

Next, a configuration of pipes of the first cleaning chamber 190 and the second cleaning chamber 192 will be described with reference to FIG. 2. FIG. 2 is a schematic view illustrating the configuration of pipes of the first cleaning chamber 190 and the second cleaning chamber 192. As illustrated in FIG. 2, the substrate processing apparatus 100 includes an air-water separation tank AWS communicating with a gas supply source GS via a pipe PP1. For example, compressed nitrogen is accumulated in the gas supply source GS, and the compressed nitrogen can be supplied to the air-water separation tank AWS via the pipe PP1.

Similarly, the substrate processing apparatus 100 includes an air-water separation tank AWS' communicating with a gas supply source GS' via a pipe PP1'. For example, compressed nitrogen is accumulated in the gas supply source GS', and the compressed nitrogen can be supplied to the air-water separation tank AWS' via the pipe PP1'.

In addition, the substrate processing apparatus 100 includes the pipe PP1 and a first valve B1. The pipe PP1 communicates between the gas supply source GS and the air-water separation tank AWS. The first valve B1 is provided between the gas supply source GS and the air-water separation tank AWS (here, the pipe PP1 as an example) and opens and closes a flow path of the gas supplied from the gas supply source GS.

Similarly, the substrate processing apparatus 100 includes a pipe PP1' and a first valve B1'. The pipe PP1' communicates between the gas supply source GS' and the air-water separation tank AWS'. The first valve B1' is provided between the gas supply source GS' and the air-water separation tank AWS' (here, the pipe PP1' as an example), and opens and closes a flow path of the gas supplied from the gas supply source GS'.

In addition, the substrate processing apparatus 100 includes a pipe PP2 that communicates with a discharge port DA of the air-water separation tank AWS, a discharge port DA' of the air-water separation tank AWS', a discharge port D1 of the first cleaning chamber 190, and a discharge port D2 of the second cleaning chamber 192, a second valve B2 that opens and closes a flow path of liquid discharged from the discharge port DA of the air-water separation tank AWS, and a second valve B2' that opens and closes a flow path of liquid discharged from the discharge port DA of the air-water separation tank AWS'. The discharge port DA of the air-water separation tank AWS and the discharge port DA' of the air-water separation tank AWS' communicate with the discharge port D1 of the first cleaning chamber 190 that cleans the substrate and the discharge port D2 of the second cleaning chamber 192 via the pipe PP2. As illustrated in FIG. 2, a discharge destination of the pipe PP2 communicates with the air.

As illustrated in FIG. 2, the first cleaning chamber 190 is provided with an adsorption stage VS1 for adsorbing the wafer W, a lift pin LP1 that moves the wafer W up and down, and a sensor S1 that detects that the wafer W has reached a preset receiving position. Here, the receiving position is a position at which the transfer robot receives the wafer W. The sensor S1 notifies a detection result to the control unit 5.

The adsorption stage VS1 is provided with a hole for vacuum-adsorbing the wafer W. Furthermore, the substrate processing apparatus 100 is provided with a pipe PP3 branching into two pipes from the air-water separation tank AWS. One branch destination of the pipe PP3 is connected to the other end part of a rotary joint RJ1. As a result, the other end part of the rotary joint RJ1 communicates with the air-water separation tank AWS. The other branch destination of the pipe PP3 is connected to a water supply source WS. As a result, the water supply source WS communicates with the air-water separation tank AWS. One end part of the rotary joint RJ1 communicates with a hole provided in the adsorption stage VS1. As a result, the hole of the adsorption stage VS1 communicates with the air-water separation tank AWS. That is, a gas discharge port GA of the air-water separation tank AWS can communicate with the adsorption stage VS1 of the first cleaning chamber 190 so that gas of the gas supply source GS is supplied to the adsorption stage VS1 of the first cleaning chamber 190.

Similarly, the substrate processing apparatus 100 is provided with a pipe PP3' branching into two pipes from the air-water separation tank AWS. One branch destination of the pipe PP3' is connected to the other end part of a rotary joint RJ2. As a result, the other end part of the rotary joint RJ2 communicates with the air-water separation tank AWS'. The other branch destination of the pipe PP3' is connected to the water supply source WS'. As a result, the water supply source WS' communicates with the air-water separation tank AWS'. One end part of the rotary joint RJ2 communicates with a hole provided in an adsorption stage VS2. As a result, the hole of the adsorption stage VS2 communicates with the air-water separation tank AWS'. That is, a gas discharge port GA' of the air-water separation tank AWS' can communicate with the adsorption stage VS2 of the second cleaning chamber 192 so that gas of the gas supply source GS' is supplied to the adsorption stage VS2 of the second cleaning chamber 192.

Similarly, as illustrated in FIG. 2, the second cleaning chamber 192 is provided with the adsorption stage VS2 for adsorbing a wafer W', a lift pin LP2 that moves the wafer W' up and down, and a sensor S2 that detects that the wafer W' has reached a preset receiving position. Here, the receiving position is a position at which the transfer robot receives the wafer W'. The sensor S2 notifies a detection result to the control unit 5.

The adsorption stage VS2 is provided with a hole for vacuum-adsorbing the wafer W'. Furthermore, the rotary joint RJ2 having one end part communicating with the hole provided in the adsorption stage VS2 is provided, and the other end part of the rotary joint RJ2 communicates with the air-water separation tank AWS' via the pipe PP3'. As a result, the hole of the adsorption stage VS2 communicates with the air-water separation tank AWS.

As illustrated in FIG. 2, the substrate processing apparatus 100 is provided with a third valve B3. The third valve B3 is provided between the air-water separation tank AWS and the first cleaning chamber 190 (here, the pipe PP3 as an example) and opens and closes a flow path between the air-water separation tank AWS and the adsorption stage VS1 of the first cleaning chamber 190.

Similarly, the substrate processing apparatus 100 is provided with a third valve B3'. The third valve B3' is provided between the air-water separation tank AWS' and the second cleaning chamber 192 (here, the piping PP3' as an example) and opens and closes a flow path between the air-water separation tank AWS' and the adsorption stage VS2 of the second cleaning chamber 192.

As illustrated in FIG. 2, the substrate processing apparatus 100 includes a vacuum generator VAC, and a pipe PP4 communicating between the vacuum generator VAC and the air-water separation tank AWS. In addition, the substrate processing apparatus 100 is provided with a fourth valve B4. The fourth valve B4 is provided between the vacuum generator VAC and the air-water separation tank AWS (here, as the pipe PP4 as an example) and opens and closes a flow path between the vacuum generator VAC and the air-water separation tank AWS. As a result, by opening the third valve B3 and the fourth valve B4 to be described later, the wafer W can be adsorbed to the adsorption stage VS1.

Similarly, the substrate processing apparatus 100 includes a vacuum generator VAC' and a pipe PP4' communicating between the vacuum generator VAC' and the air-water separation tank AWS'. In addition, the substrate processing apparatus 100 is provided with a fourth valve B4'. The fourth valve B4' is provided between the vacuum generator VAC' and the air-water separation tank AWS' (here, the pipe PP4' as an example) and opens and closes a flow path between the vacuum generator VAC' and the air-water separation tank AWS'. As a result, by opening the third valve B3' and the fourth valve B4' to be described later, the wafer W' can be adsorbed to the adsorption stage VS2.

As illustrated in FIG. 2, the substrate processing apparatus 100 includes a fifth valve B5. The fifth valve B5 is provided on a side of the water supply source WS from a branch point DP on the pipe PP3. Pure water (DIW) is stored in the water supply source WS, and the pure water (DIW) can be supplied from the water supply source WS to the air-water separation tank AWS.

Similarly, the substrate processing apparatus 100 includes a fifth valve B5'. The fifth valve B5' is provided on the side of the water supply source WS from a branch point DP' on the pipe PP3'. The pure water (DIW) is stored in the water supply source WS', and the pure water (DIW) can be supplied from the water supply source WS' to the air-water separation tank AWS.

The control unit 5 controls the first valve B1, the second valve B2, the third valve B3, the fourth valve B4, and the fifth valve B5. Similarly, the control unit 5 controls the first valve B1', the second valve B2', the third valve B3', the fourth valve B4', and the fifth valve B5'. Furthermore, the control unit 5 controls the lift pin LP1 and the lift pin LP2.

[Processing of Control Unit 5 at Time of Discharging Liquid]

Next, since the processing of the control unit 5 relating to the drainage of the air-water separation tank AWS is the same as the processing of the control unit 5 relating to the drainage of the air-water separation tank AWS', the air-water separation tank AWS is taken as a representative target and the processing of the control unit 5 when the liquid accumulated in the air-water separation tank AWS is discharged will be described. After preset gas supply time has elapsed from when the first valve B1 is opened and the gas can no longer be discharged from the air-water separation tank AWS, the control unit 5 controls to close the first valve B1 and close the second valve B2 after the first valve B1 is closed. Specific processing will be described later with reference to FIG. 4. As a result, by supplying the gas to the air-water separation tank AWS during the gas supply time, a trigger for drainage can be given. Therefore, thereafter, the liquid accumulated in the air-water separation tank AWS can naturally be drained. Furthermore, since the gas is supplied to the air-water separation tank AWS only during the gas supply time, a back-flow of the contaminated atmosphere and/or liquid into the first cleaning chamber 190 can be suppressed, and a possibility of contamination of the substrate in the first cleaning chamber 190 can be reduced.

Figure 3:
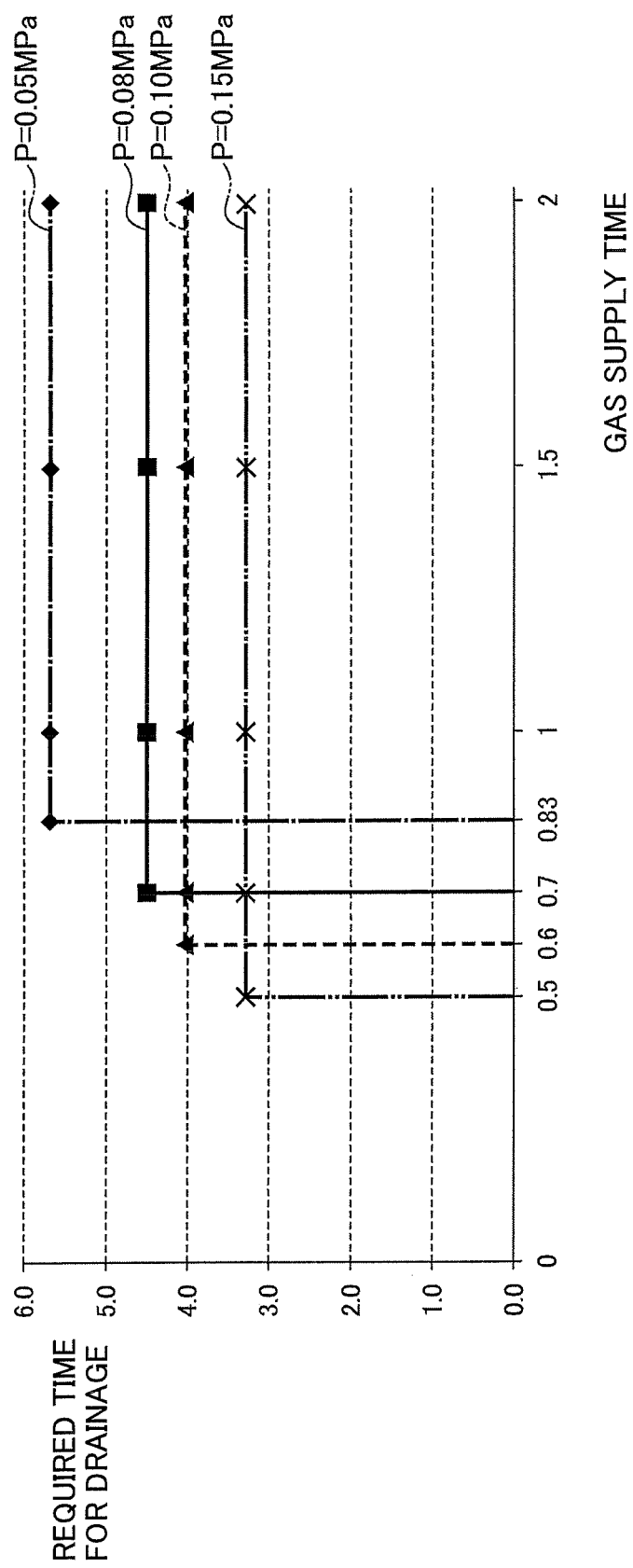
FIG. 3 is a graph illustrating a relationship between required time for drainage and gas supply time for each pressure of a gas of a gas supply source.

Here, the gas supply time will be described with reference to FIG. 3. FIG. 3 is a graph illustrating an example of a relationship between required time for drainage and the gas supply time for each pressure of the gas of the gas supply source. In FIG. 3, the required time for drainage is time taken to discharge 200 ml of liquid accumulated in the air-water separation tank AWS when the gas of the gas supply source is nitrogen and the capacity of the air-water separation tank AWS is 600 ml. A relationship when a pressure P of the gas of the gas supply source in FIG. 3 was 0.08 MPa was obtained through an experiment. Relationships when the pressure P of the gas of the gas supply source is 0.05, 0.10, and 0.15 in FIG. 3 are predicted from the following calculation formula.

When the pressure P of the gas of the gas supply source was 0.08 MPa, if the gas supply time was 0.7 seconds or longer, all the liquid accumulated in the air-water separation tank AWS could be discharged. Furthermore, when the pressure P of the gas of the gas supply source was is 0.08 MPa, if the gas supply time was 2.0 seconds or shorter, no back-flow of the contaminated atmosphere and/or liquid into the first cleaning chamber 190 or the second cleaning chamber 192 was observed.

As illustrated in FIG. 3, even if the gas supply time is changed, the required time for drainage is the same as long as the pressure P of the gas of the gas supply source is same. In this way, the required time for drainage is determined for each pressure P of the gas of the gas supply source. Therefore, the required time for drainage is determined according to the pressure P of the gas of the gas supply source GS.

It is necessary to close the second valve B2 after when all of the liquid accumulated in the air-water separation tank AWS is drained. For example, when the pressure P of the gas of the gas supply source is 0.08 MPa, the required time for drainage is 4.5 seconds as can be seen from FIG. 3. Here, when a gas supply time is one second, time from when the first valve B1 is closed until when the second valve B2 is closed is set to three ($=4.5-1$) seconds or longer. Therefore, the time from when the first valve B1 is closed until when the second valve B2 is closed is set according to the required time for drainage that is set according to the pressure of the gas of the gas supply source GS. As a result, the second valve B2 can be opened for time longer than the required time for drainage. Therefore, all of the liquid accumulated in the air-water separation tank AWS can be discharged.

According to Bernoulli's principle, a flow rate v is expressed by the following equation.

$$v=(2\times P/\rho)^{0.5}$$

Here, P is the pressure of the gas of the gas supply source and $\rho$ is fluid density. Therefore, an amount of discharged liquid flowing per unit time (hereinafter referred to as flow rate) Q is expressed by the following equation.

$$Q=C\times A\times(2\times P/\rho)^{0.5}$$

Here, C is a runoff coefficient and A is a flow path area. Therefore, when a total amount of the liquid discharged from the air-water separation tank AWS is a total discharged amount V, required time for drainage Tf is derived from the following equation (1).

$$Tf=V/Q \qquad (1)$$

Furthermore, in the present embodiment, $(P_L+0.1)/(P_L+0.1)\leq 0.5$ is established because the discharge destination of the pipe PP2 communicates with the air and a downstream pressure $P_L$ is 0. Therefore, a gas flow rate q can be calculated with the choke flow, and the gas flow rate q (L/min) is derived according to the following equation (2).

$$q=120\times S\times(P+0.1)\sqrt{(293/273+t)} \qquad (2)$$

Here, P is the pressure (MPa) of the gas of the gas supply source, S is a cross-sectional area inside a part having the smallest inner diameter of the pipe PP1 connecting between the gas supply source GS and the air-water separation tank AWS, and t is temperature (° C.). Here, the cross-sectional area S inside the part having the smallest inner diameter of the pipe PP1 is 12.56 mm$^2$ as an example and the temperature t is 20° C. The gas flow rate q is proportional to the pressure of the gas of the gas supply source and the cross-sectional area inside the part having the smallest inner diameter of the pipe PP1 according to equation (2).

As illustrated in FIG. 3, in the experiment when the pressure P of the gas of the gas supply source was 0.08 MPa, drainage was not performed unless gas (here, nitrogen) was supplied to the air-water separation tank AWS at least for 0.7 seconds. Therefore, the minimum required volume of the gas (minimum supply volume) to be supplied in order to give the trigger for drainage is 3.17 ($=4.53$ (L/second)$\times 0.7$ (seconds)) L.

Since the gas flow rate q at 0.05 MPa is 3.78 ($=227/60$) L/second according to the equation (2), the minimum gas supply time necessary for drainage is 0.83 ($=3.17$ (L)/3.78 (L/second)) seconds.

Similarly, since the gas flow rate q at 0.1 MPa is 5.03 ($=302/60$) L/second according to equation (2), the minimum gas supply time necessary for draining is 0.6 ($=3.17$ (L)/5.03 (L/second)) seconds.

Similarly, since the gas flow rate q at 0.15 MPa is 6.28 ($=377/60$) L/second according to equation (2), the minimum gas supply time necessary for draining is 0.50 ($=3.17$ (L)/6.28 (L/second)) seconds.

As illustrated in FIG. 3, the gas supply time is equal to or longer than the minimum gas supply time necessary for drainage. Since the gas flow rate q is proportional to the pressure P of the gas of the gas supply source according to equation (2), the minimum gas supply time is inversely proportional to the pressure P of the gas of the gas supply source. For the above reason, the minimum gas supply time according to the present embodiment is set at least according to the pressure of the gas of the gas supply source. As a result, since the gas can be supplied to the air-water separation tank AWS for time longer than the minimum gas supply time, the trigger for drainage from the air-water separation tank AWS can be given.

Furthermore, since the gas flow rate q is proportional to the cross-sectional area S inside the part having the smallest inner diameter of the pipe PP1 according to equation (2), the minimum gas supply time is inversely proportional to the cross-sectional area S the inside the part having the smallest inner diameter of the pipe PP1. For the above reason, the minimum gas supply time according to the present embodiment is set according to the cross-sectional area inside the part having the smallest inner diameter of the pipe PP1 connecting the gas supply source GS and the air-water separation tank AWS. As a result, this minimum gas supply time can be appropriately set, and the gas is supplied to the air-water separation tank AWS for time equal to or longer than the minimum gas supply time. Therefore, the trigger for drainage from the air-water separation tank AWS can be given.

Furthermore, the minimum required volume of the gas (minimum supply volume) to be supplied in order to give the trigger for drainage depends on the amount of liquid present in the air-water separation tank AWS. For the above reason, the minimum gas supply time may be further determined according to the minimum required volume of the gas to be supplied in order to give the trigger for drainage when the air-water separation tank AWS is full. For example, the minimum required volume of the gas (for example, nitrogen) to be supplied in order to give a trigger for drainage when the air-water separation tank AWS is full is a value obtained by multiplying the volume of the air-water separating tank (for example, 0.6 L) by a fixed value (5.27). Therefore, in a case where the volume of the air-water separation tank is, for example, 0.6 L, the minimum required volume of the gas to be supplied in order to give the trigger for drainage is 3.16 (≈0.6×5.27) L. Since the gas flow rate q at 0.1 MPa is 5.03 (=302/60) L/second according to equation (2), the minimum gas supply time is 0.6 (≈3.16/5.03) seconds. As a result, the minimum gas supply time can be set to time during which an amount of a gas with which an amount of liquid when the air-water separation tank AWS is full can be discharged is supplied. The gas is supplied to the air-water separation tank AWS for a time period longer than this minimum gas supply time period. Therefore, the trigger for drainage from the air-water separation tank AWS can be given regardless of an amount of liquid in the air-water separation tank AWS. Then, drainage can be performed in a short time (for example, in 0.6 seconds), and discharge of gas (for example, nitrogen) that becomes useless and a source of contamination can be stopped.

Note that a detection unit that detects an amount of the liquid present in the air-water separation tank AWS may be provided. The detection unit is, for example, a liquid level sensor provided inside the air-water separation tank AWS. Then, the gas supply time according to the present embodiment may be set by the control unit 5 according to the amount of the liquid present in the air-water separation tank AWS detected by the detection unit. Specifically, for example, the control unit 5 may set the gas supply time such that the gas supply time increases as the amount of the liquid present in the air-water separation tank AWS increases. As a result, the gas supply time such that the trigger for drainage can be given can be appropriately set. Therefore, the liquid can be drained from the air-water separation tank AWS.

[Processing of Control Unit 5 at Time of Peeling Off Substrate from Adsorption Stage]

Next, the processing of the control unit 5 when the substrate is peeled off from the adsorption stage VS1 as a representative of the adsorption stage VS1 and the adsorption stage VS2 will be described.

The control unit 5 controls to open the second valve B2 and the third valve B3 in order to peel off the substrate from the adsorption stage VS1 of the first cleaning chamber 190. Here, the pressure of the gas supply source GS is set within a range in which the substrate can be peeled off from the adsorption stage VS1 of the first cleaning chamber 190 and the substrate does not jump. Note that "the substrate jumps" means that the substrate suddenly come off from the adsorption stage, and if the substrate unintentionally jumps from the stage, the substrate may be damaged. With this setting, the substrate can be peeled off from the adsorption stage VS1 and the substrate can be lifted to the receiving position at which the transfer robot 22 receives the substrate.

As a result of an experiment using an actual machine, in the case of a wafer having a diameter of 300 mm, a pressure at which that the wafer can be peeled off from the adsorption stage VS1 was 0.05 MPa or more. Furthermore, in the case of the wafer having a diameter of 300 mm, a pressure at which the wafer does not jump is 0.15 MPa or less. Therefore, in the case of the wafer having a diameter of 300 mm, the pressure P of the gas supply source is 0.05 to 0.15 MPa. As a result, in the case of the wafer having a diameter of 300 mm, the wafer can be peeled off from the adsorption stage VS1 and the wafer can be lifted to the receiving position at which the transfer robot 22 receives the wafer.

Figure 4:
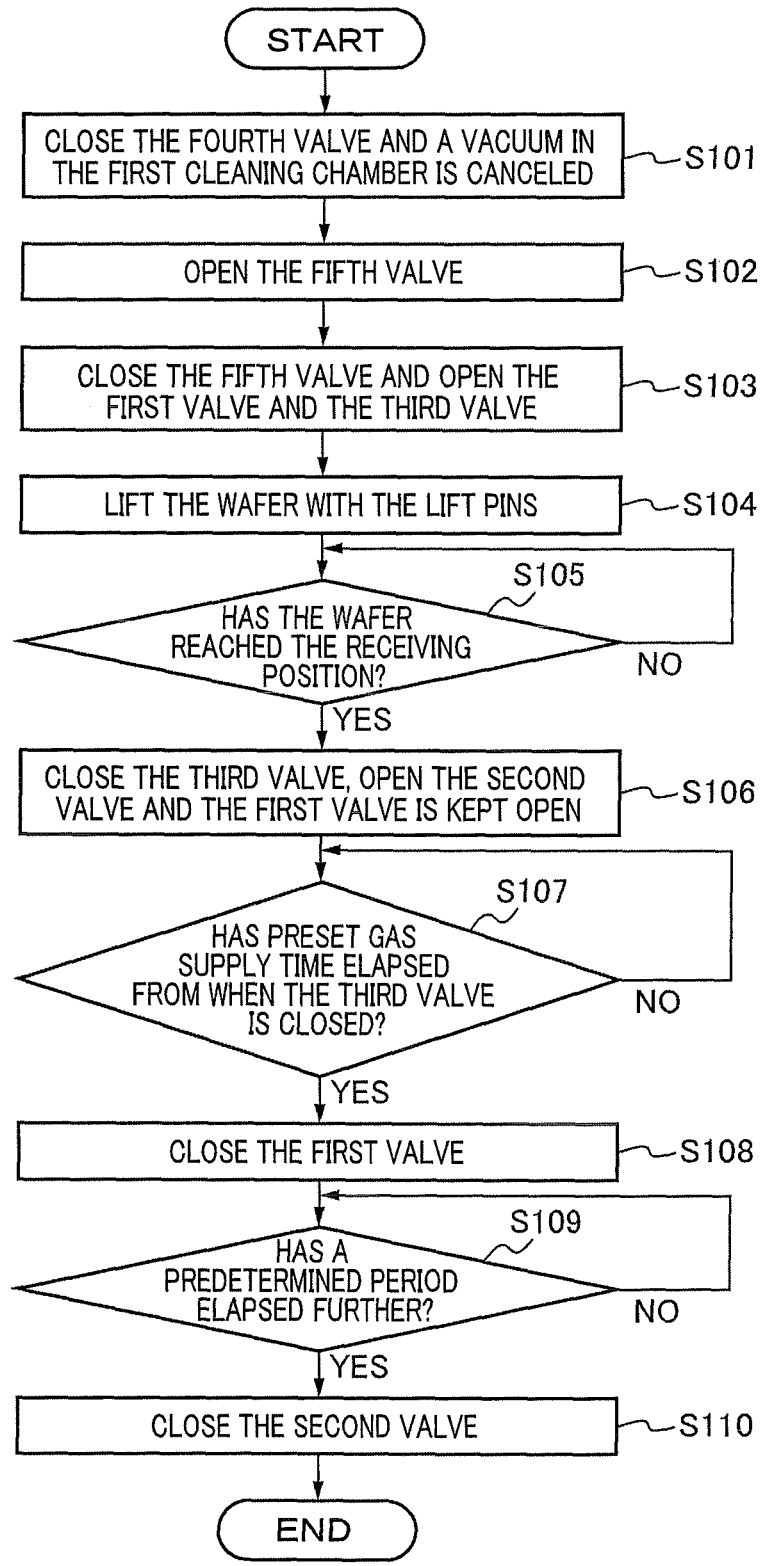
FIG. 4 is a flowchart illustrating an exemplary flow of processing relating to drainage of an air-water separation tank AWS.

Next, since the processing relating to the drainage of the air-water separation tank AWS is the same as the processing relating to the drainage of the air-water separation tank AWS', the air-water separation tank AWS is taken as a representative target and the processing relating to the drainage of the air-water separation tank AWS will be described with reference to FIG. 4. FIG. 4 is a flow chart illustrating an exemplary flow of the processing relating to the drainage of the air-water separation tank AWS. FIG. 4 illustrates an example of a case where the wafer is cleaned in the first cleaning chamber 190.

(Step S101) First, the control unit 5 controls to close the fourth valve B4. As a result, a vacuum in the first cleaning chamber 190 is canceled.

(Step S102) Next, the control unit 5 controls to open the fifth valve B5. As a result, the pipe PP3 is filled with water.

(Step S103) Next, the control unit 5 controls to close the fifth valve B5 and open the first valve B1 and the third valve B3. As a result, the water is pressed by the nitrogen gas and at the same time the wafer W is pressed by the nitrogen gas. As a result, the wafer W is peeled off from the adsorption stage VS1.

(Step S104) Next, the control unit 5 controls to lift the wafer W with the lift pins LP1. As a result, the wafer W is separated from the adsorption stage VS1.

(Step S105) Next, the control unit 5 determines whether the wafer W has reached the receiving position on the basis of the detection result of the sensor S1.

(Step S106) In a case where the wafer W has reached the receiving position in step S104, the control unit 5 controls to close the third valve B3 and open the second valve B2. Also, at this point of time, the first valve B1 is kept open. Since the second valve B2 opens, drainage from the air-water separation tank AWS is started.

(Step S107) Next, the control unit 5 determines whether preset gas supply time has elapsed from when the third valve B3 is closed.

(Step S108) In a case where the preset gas supply time has elapsed from when the third valve B3 is closed in step S107, the control unit 5 controls to close the first valve B1. Note that however, in a case where a process of peeling off the wafer is not necessary, since there is originally no need to open the third valve B3, the third valve B3 is closed beforehand and there is no process until the third valve B3 is closed in step S106. In that case, there is no process until step S106, and the control unit 5 starts with controlling so as to open the first valve B1 and the second valve B2 and counts time from when the first valve B1 is opened. In any case, the control unit 5 counts time from when the first valve B1 is opened and the gas can no longer be discharged from the air-water separation tank AWS.

In this way, after the preset gas supply time has elapsed from when the first valve B1 is opened and the gas can no longer be discharged from the air-water separation tank AWS (for example, when the third valve B3 is closed in step S107), the control unit 5 controls to close the first valve B1.

(Step S109) Next, the control unit 5 determines whether a predetermined period has elapsed further from when the first valve B1 is closed. As described above, this predetermined period is set according to the required time for drainage set according to the pressure of the gas of the gas supply source GS. That is, the predetermined period is set so that the total time of the gas supply time and the predetermined period becomes equal to or longer than the required time for drainage.

(Step S110) In a case where the predetermined period has elapsed in step S109, the control unit 5 controls to close the second valve B2.

As described above, the substrate processing apparatus 100 according to the present embodiment includes the first valve B1 which is provided between the gas supply source GS and the air-water separation tank AWS and opens and closes the gas flow path supplied from the gas supply source GS. In addition, the substrate processing apparatus 100 includes the second valve B2 for opening and closing a flow path of the liquid discharged from the discharge port DA of the air-water separation tank AWS. In addition, the substrate processing apparatus 100 includes a control unit 5 that controls the first valve B1 and the second valve B2. The discharge port DA of the air-water separation tank AWS communicates with the discharge port of the first cleaning chamber 190 and the second cleaning chamber 192 that cleans the substrates. Then, after the preset gas supply time has elapsed from when the first valve B1 is opened and gas can no longer be discharged from the air-water separation tank AWS, the control unit 5 controls to close the first valve B1 and closes the second valve B2 after the first valve B1 is closed.

With this configuration, by supplying the gas to the air-water separation tank AWS during the gas supply time, the trigger for drainage can be given. As a result, thereafter, the liquid accumulated in the air-water separation tank AWS is naturally drained. Furthermore, since the gas is supplied to the air-water separation tank AWS only during the gas supply time, a back-flow of the contaminated atmosphere and/or liquid into the first cleaning chamber 190 can be suppressed, and a possibility of contamination of the substrate in the cleaning chamber can be reduced.

Strainers are provided at the drainage ports of the first cleaning chamber 190 and the second cleaning chamber 192, and the strainer collects residues (debris of the substrate and dirt) generated in the cleaning tank. In a case where the gas is continuously supplied to the air-water separation tank, there is also a problem that this gas is supplied to the drainage ports of the first cleaning chamber 190 and the second cleaning chamber 192 via the drain pipe and there is a possibility that the strainer blows off due to the pressure of the gas. Meanwhile, according to the substrate processing apparatus 100 according to the present embodiment, the back-flow of the contaminated atmosphere and/or liquid into the first cleaning chamber 190 or the second cleaning chamber 192 can be suppressed. As a result, a probability that the strainer blows off can be reduced.

Note that a program for executing respective processing of the control unit of the present embodiment is recorded in a computer readable recording medium, the program recorded in the recording medium is read by a computer system and executed by a processor, and in this way, the above-described various kinds of processing related to the control unit of the present embodiment may be performed.

Note that the substrate processing apparatus 100 according to the present embodiment is configured to include two cleaning chambers, the first cleaning chamber 190 and the second cleaning chamber 192, but not limited this configuration, and the substrate processing apparatus 100 according to the present embodiment may be configured to include one cleaning chamber or three or more cleaning chambers. Furthermore, the first cleaning chamber 190 and the second cleaning chamber 192 are configured to be disposed in a state in which the first cleaning chamber 190 and the second cleaning chamber 192 are stacked in the two upper and lower stages. However, the first cleaning chamber 190 and the second cleaning chamber 192 are not limited to this configuration and may be disposed while being separated in a horizontal direction without being stacked.

As described above, the present technique is not limited to the above embodiment as it is, and constituent elements can be modified and embodied at an implementation stage without departing from the gist of the present technique. Furthermore, various techniques can be formed by appropriately combining a plurality of constituent elements disclosed in the above embodiment. For example, the diameter of a target substrate is not limited to 300 mm, and may be, for example, 450 mm. Furthermore, for example, some constituent elements may be deleted from all the constituent elements illustrated in the embodiment. In addition, the constituent elements across different embodiments may be appropriately combined.

REFERENCE SIGNS LIST

1 Housing
2 Load/unload unit
3 Polishing unit
3A First polishing unit
3B Second polishing unit
3C Third polishing unit
3D Fourth polishing unit
4 Cleaning unit
5 Control unit
6 First linear transporter
7 Second linear transporter
10 Polishing pad
11 Lifter
12 Swing Transporter
20 Front load unit
21 Traveling mechanism
22 Transfer robot
30A, 30B, 30C, 30D Table
31A, 31B, 31C, 31D Top ring (polishing head)
32A, 32B, 32C, 32D Polishing liquid supply nozzle
33A, 33B, 33C, 33D Dresser
34A, 34B, 34C, 34D Atomizer
100 Substrate processing apparatus
190 First cleaning chamber
191 First transfer chamber
192 Second cleaning chamber
193 Second transfer chamber
194 Drying room
AWS, AWS' Air-water separation tank
B1, B1' First valve
B2, B2' Second valve
B3, B3' Third valve
B4, B4' Fourth valve
B5, B5' Fifth valve
D1, D2 Discharge port
GS, GS' Gas supply source
LP1, LP2 Lift pin
PP1, PP2, PP3, PP4 Pipe
RJ1, RJ2 Rotary joint
S1, S2 Sensor
TP1 First transfer position
TP2 Second transfer position
TP3 Third transfer position
TP4 Fourth transfer position
TP5 Fifth transfer position
TP6 Sixth transfer position
TP7 Seventh transfer position
VAC, VAC' Vacuum generator
VS1, VS2 Adsorption stage
WS, WS' Water supply source

The invention claimed is:
1. A substrate processing apparatus comprising:
a first valve provided between a gas supply source and an air-water separation tank, the first valve opening and closing a flow path of a gas supplied from the gas supply source;

a second valve that opens and closes a flow path of liquid discharged from a discharge port of the air-water separation tank; and a control unit that controls the first valve and the second valve, wherein the discharge port of the air-water separation tank communicates with a discharge port of a cleaning chamber that cleans the substrate, and the control unit controls to close the first valve after preset gas supply time elapses from when the first valve is opened and gas can no longer be discharged from the air-water separation tank and controls to close the second valve after the first valve is closed.

2. The substrate processing apparatus according to claim 1, wherein the gas supply time is equal to or longer than minimum gas supply time necessary for drainage and the minimum gas supply time is set according to at least a pressure of a gas of the gas supply source.

3. The substrate processing apparatus according to claim 2, wherein the minimum gas supply time is set according to a cross-sectional area inside a part having a smallest inner diameter of a pipe connecting between the gas supply source and the air-water separation tank.

4. The substrate processing apparatus according to claim 2, wherein the minimum gas supply time is set according to a minimum required volume of a gas to be supplied in order to give a trigger for drainage when the air-water separation tank is full.

5. The substrate processing apparatus according to claim 1, wherein a gas discharge port of the air-water separation tank capable of communicating with an adsorption stage of the cleaning chamber so that the gas of the gas supply source is supplied to the adsorption stage of the cleaning chamber, and a pressure of the gas supply source is set within a range in which a substrate can be peeled off from the adsorption stage of the cleaning chamber and the substrate does not jump.

6. The substrate processing apparatus according to claim 5, wherein the substrate is a wafer having a diameter of 300 mm, and the pressure of the gas supply source is 0.05 to 0.15 MPa.

7. The substrate processing apparatus according to claim 1, wherein time from when the first valve is closed until when the second valve is closed is set according to required time for drainage that is set according to the pressure of the gas of the gas supply source.

8. A discharge method of liquid in an air-water separation tank in a substrate processing apparatus, the method comprising steps of:

closing a first valve that is provided between a gas supply source and the air-water separation tank and that opens and closes a flow path of a gas supplied from the gas supply source after preset gas supply time elapses from when the first valve is opened and the gas can no longer be discharged from the air-water separation tank; and closing a second valve that opens and closes a flow path of the liquid discharged from a discharge port of the air-water separation tank after the first valve is closed.

9. A computer readable recording medium storing a program causes a computer to function as a control unit that controls a first valve that is provided between a gas supply source and an air-water separation tank and that opens and closes a flow path of a gas supplied from the gas supply source, and a second valve that opens and closes a flow path of liquid discharged from a discharge port of the air-water separation tank, wherein the discharge port of the air-water separation tank communicates with a discharge port of a cleaning chamber for cleaning a substrate, and the control unit controls to close the first valve after a preset gas supply time elapses from when the first valve is opened and a gas can no longer be discharged from the air-water separation tank and controls to close the second valve after the first valve is closed.

* * * * *